(12) United States Patent
Bolln

(10) Patent No.: US 9,678,161 B2
(45) Date of Patent: Jun. 13, 2017

(54) WIND ENERGY INSTALLATION AND METHOD FOR TESTING A ROTATIONAL SPEED RELAY OF A WIND ENERGY INSTALLATION

(75) Inventor: Soenke Bolln, Heide (DE)

(73) Assignee: SENVION SE, Hamburg (DE)

( * ) Notice: Subject to any disclaimer, the term of this patent is extended or adjusted under 35 U.S.C. 154(b) by 923 days.

(21) Appl. No.: 13/703,264

(22) PCT Filed: Jun. 3, 2011

(86) PCT No.: PCT/EP2011/059193
§ 371 (c)(1),
(2), (4) Date: Dec. 10, 2012

(87) PCT Pub. No.: WO2011/154318
PCT Pub. Date: Dec. 15, 2011

(65) Prior Publication Data
US 2013/0082713 A1    Apr. 4, 2013

(30) Foreign Application Priority Data

Jun. 10, 2010 (DE) .......................... 10 2010 023 279
Jun. 22, 2010 (DE) .......................... 10 2010 024 566

(51) Int. Cl.
| | | |
|---|---|---|
| G01R 31/327 | (2006.01) | |
| F03D 7/04 | (2006.01) | |
| F03D 17/00 | (2016.01) | |

(52) U.S. Cl.
CPC ........... *G01R 31/327* (2013.01); *F03D 7/042* (2013.01); *F03D 17/00* (2016.05);
(Continued)

(58) Field of Classification Search
CPC ..... F01D 21/02; F01D 21/003; Y02E 10/723; Y02E 10/722; F05D 2270/021;
(Continued)

(56) References Cited

U.S. PATENT DOCUMENTS

| | | |
|---|---|---|
| 4,217,617 A | 8/1980 | Rossi et al. |
| 4,218,879 A * | 8/1980 | Hagrman et al. .......... 60/39.281 |

(Continued)

OTHER PUBLICATIONS

International Preliminary Report on Patentability and Written Opinion dated Dec. 10, 2012, directed to International Application No. PCT/EP2011/059193; 14 pages.
(Continued)

*Primary Examiner* — Son Le
*Assistant Examiner* — Dustin Dickinson
(74) *Attorney, Agent, or Firm* — Morrison & Foerster LLP

(57) ABSTRACT

The disclosure relates to checking a rotational speed relay of a wind turbine. The wind turbine comprises a rotational speed sensor for the rotational speed of a shaft. The rotational speed sensor outputs a rotational speed signal, which is fed to a signal input of the rotational speed relay. According to disclosure, the rotational speed signal fed to the rotational speed relay is first inactivated. Then a signal generator is activated, which produces a check signal equivalent to the rotational speed signal. The check signal is fed to the signal input of the rotational speed relay. The signal generator is operated with a check signal that is beyond a rotational speed limit, and a check is performed to determine if the rotational speed relay generates a switch-off command. This allows the functional capability of the rotational speed relay to be checked reliably and at low cost.

9 Claims, 3 Drawing Sheets

(52) U.S. Cl.
CPC ..... *F05B 2260/83* (2013.01); *F05B 2270/327* (2013.01); *F05B 2270/809* (2013.01); *Y02E 10/723* (2013.01)

(58) Field of Classification Search
CPC ..... H02H 7/093; F03D 7/042; F03D 11/0091; F05B 2260/83; F05B 2270/327; F05B 2270/809; F05B 2270/3201; G01R 31/327; G01R 31/3271
See application file for complete search history.

(56) References Cited

U.S. PATENT DOCUMENTS

| | | | | |
|---|---|---|---|---|
| 4,629,980 A | * | 12/1986 | Overby | 324/166 |
| 5,422,826 A | * | 6/1995 | Cousineau | F03D 7/0204 416/36 |
| 5,648,645 A | * | 7/1997 | Arpagaus | B66B 5/06 187/282 |
| 5,652,486 A | * | 7/1997 | Mueller | B60L 3/00 180/171 |
| 6,771,903 B1 | * | 8/2004 | Cousineau | F03D 7/00 398/115 |
| 6,898,512 B1 | * | 5/2005 | Ritter | F02D 29/04 123/350 |
| 2004/0084014 A1 | * | 5/2004 | Hawkins | B60W 30/18 123/395 |
| 2006/0132994 A1 | * | 6/2006 | Delmerico | F03D 7/028 361/20 |
| 2007/0170724 A1 | * | 7/2007 | Calley | F03D 7/0256 290/44 |
| 2008/0101918 A1 | | 5/2008 | Block et al. | |
| 2008/0213084 A1 | * | 9/2008 | Rosenfield et al. | 415/30 |
| 2009/0193894 A1 | | 8/2009 | Kabatzke | |
| 2009/0295161 A1 | | 12/2009 | Steiner et al. | |

OTHER PUBLICATIONS

International Search Report mailed Jan. 20, 2012, directed towards International Application No. PCT/EP2011/059193; 4 pages.

* cited by examiner

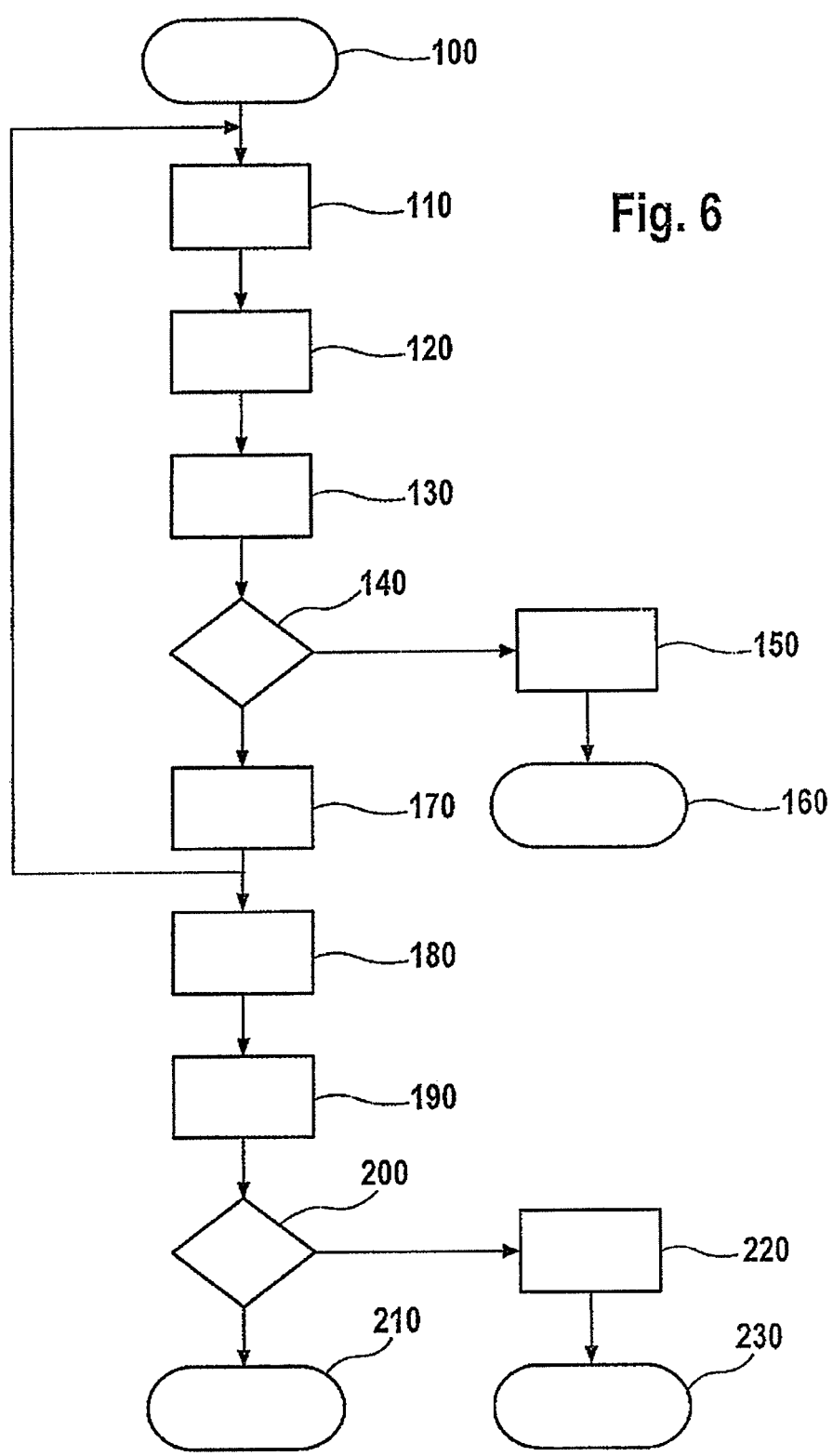

WIND ENERGY INSTALLATION AND METHOD FOR TESTING A ROTATIONAL SPEED RELAY OF A WIND ENERGY INSTALLATION

REFERENCE TO RELATED APPLICATIONS

This application is a national stage application under 35 USC 371 of International Application No. PCT/EP2011/059193, filed Jun. 3, 2011, which claims the priority of German Application No. 102010023279.3, filed Jun. 10, 2010, and German Application No. 102010024566.6, filed Jun. 22, 2010, the entire contents of which are incorporated herein by reference.

FIELD OF THE INVENTION

The invention relates to a method for testing a rotational speed relay of a wind energy installation. The wind energy installation comprises a rotational speed sensor for the rotational speed of a shaft. The rotational speed sensor outputs a rotational speed signal which is supplied to a signal input of the rotational speed relay. The rotational speed relay generates a switch-off command if the rotational speed of the shaft exceeds a predefined rotational speed limit value. The invention also relates to a wind energy installation for carrying out the method.

BACKGROUND OF THE INVENTION

The rotational speed at which the rotor of a wind energy installation rotates is a safety-relevant parameter. If the rotational speed moves out of the intended rotational speed range, the wind energy installation may be damaged. The controller for the wind energy installation is set up such that the relevant rotational speed limits are not exceeded during normal operation. However, if faults occur in the wind energy installation, for example a defect in the controller or a faulty signal from a sensor, the situation may occur in which the wind energy installation no longer operates as intended and the rotational speed limits are exceeded.

An additional safety mechanism is provided for this situation. The rotational speed is continuously monitored using a rotational speed relay and a switch-off command is generated if a rotational speed limit value is exceeded. The switch-off command which has priority over the normal controller commands causes the wind energy installation to be deactivated as quickly as possible.

The rotational speed relay is checked for proper operation at regular maintenance intervals. Hitherto, the following method has been provided for this purpose. A service engineer travels to the wind energy installation and stops the latter. The rotational speed relay is reprogrammed to a new rotational speed limit value which can be exceeded during normal operation. The service engineer then starts the wind energy installation, with the result that the lower rotational speed limit value which has now been newly set is exceeded. The service engineer tests whether the rotational speed relay provides a switch-off command in the proper manner. If the test is positive, the wind energy installation is stopped again, the rotational speed relay is programmed back to the original rotational speed limit value and the wind energy installation is changed to normal operation again. This process is prone to errors. It is conceivable, inter alia, for the rotational speed relay to be programmed to an incorrect limit value, rather than the original limit value, at the end.

SUMMARY OF THE INVENTION

On the basis of the prior art mentioned at the outset, the invention is based on the object of presenting a wind energy installation and a method which can be used to check the rotational speed relay in a cost-effective and reliable manner. The object is achieved by the features as broadly described herein. Advantageous developments are the subject matter of the detailed embodiments described below.

A number of terms are first of all explained. In the sense of the invention, a shaft is any element of the mechanical drive train, the rotational speed of which is in a fixed relationship with respect to the rotational speed of the rotor. The term shaft comprises, for example, the rotor shaft as well as rotating components of the transmission and generator. The rotational speed of the rotor can be directly derived from the rotational speed of the shaft. The rotational speed signal represents the rotational speed of the shaft.

The rotational speed limit value limits the rotational speed range within which the wind energy installation moves during normal operation. The rotational speed limit value may provide an upper or lower limit for the rotational speed range. Both the case in which the upper limit value is exceeded and the case in which the lower limit value is undershot are considered to be cases in which the rotational speed limit value is exceeded.

The switch-off command may be transmitted, in the form of an electrical signal, to a component of the wind energy installation which switches off the wind energy installation. The transmission of the switch-off command may also involve opening the safety chain of the wind energy installation. The safety chain denotes a line via which a plurality of safety-relevant elements of the wind energy installation are coupled to one another. If a fault occurs in one of the elements, the safety chain is opened, which results in the wind energy installation being stopped.

In the method according to the invention, the rotational speed signal is first of all deactivated, with the result that the rotational speed relay no longer receives a signal from the rotational speed sensor. This may be effected, for example, by interrupting a corresponding cable connection. It is also possible to stop the wind energy installation, with the result that the rotational speed sensor no longer provides a signal for this reason. A signal generator which generates a test signal equivalent to the rotational speed signal is also activated. A test signal is equivalent to a rotational speed signal when the rotational speed relay can gather an item of rotational speed information from the test signal. The signal generator is operated in such a manner that it generates a test signal beyond the rotational speed limit value. The rotational speed relay thus gathers the information that the rotational speed limit value has been exceeded from the test signal. When the limit value has been exceeded, a rotational speed relay operating properly must provide a switch-off command. A test is carried out in order to determine whether this switch-off command is actually provided.

Using a synthetic test signal to feign particular rotational speeds to the rotational speed relay makes it possible to test the response of the rotational speed relay without the shaft actually having this rotational speed. In particular, this makes it possible to carry out checks outside the normal rotational speed range. There is no need for the error-prone reprogramming of the rotational speed relay, which is otherwise required in order to be able to simulate situations in which the limit value is exceeded in the normal rotational speed range.

The method can be advantageously carried out in such a manner that the signal generator is first of all operated with a test signal which is within the normal rotational speed range, that is to say with which no rotational speed limit value is exceeded. The test signal can then be changed such that the rotational speed limit value is exceeded. This makes it possible to reliably check whether the rotational speed relay is triggered at the correct time.

As explained, the method can be carried out in such a manner that a service engineer stops the wind energy installation in situ and connects a signal generator to the rotational speed relay instead of the rotational speed sensor. Alternatively, provision may also be made for an automatic changeover between the rotational speed signal from the rotational speed sensor and the test signal from the signal generator. This makes it possible to check the rotational speed relay during remote maintenance. If necessary, the wind energy installation may remain in operation during the check if it is possible to resort to alternative sensors in the wind energy installation.

A wind energy installation often comprises a plurality of rotational speed sensors which are used to detect the rotational speed of the rotor shaft and/or of shafts coupled to the rotor shaft. For example, two redundant rotational speed sensors may be arranged on the rotor shaft which is simultaneously the input shaft of the transmission. A further rotational speed sensor may be situated on the generator shaft as the output shaft of the transmission. The rotational speed relay may be designed in such a manner that it receives the rotational speed signals from a plurality of rotational speed sensors via a plurality of signal inputs. A switch-off command is preferably already generated when only one of the rotational speed sensors reports that the rotational speed limit value has been exceeded. Applying the test signal from the signal generator to the different signal inputs in succession makes it possible to check the proper operation of a plurality of signal inputs. A plurality of rotational speed relays may alternatively be provided, one rotational speed relay preferably being assigned to each rotational speed sensor. The plurality of rotational speed relays may be tested in succession or in a parallel manner.

If a plurality of rotational speed sensors are present, the proper method of operation of these sensors may also be checked within the scope of the method according to the invention. For this purpose, the rotational speed signals from the different rotational speed sensors are compared with one another as the shaft rotates. With proper operation, all rotational speed signals would have to provide the same rotational speed information; a discrepancy between the items of rotational speed information indicates a fault. If one rotational speed sensor is on a fast shaft and one rotational speed sensor is on a slow shaft, the rotational speeds of the shafts being in a fixed relationship, the rotational speed signals must be accordingly converted before a comparison is possible. This applies, for example, to rotational speed sensors on the slow rotor shaft and on the fast generator shaft, which are coupled to one another in a fixed relationship via the transmission. If necessary, it is additionally possible to check whether identical rotational speed signals are interpreted as the same rotational speed by different components. The different components may be, for example, two rotational speed relays or one rotational speed relay and the controller for the wind energy installation. This check makes it possible to discover further possible faults in the wind energy installation. Alternatively, it is possible to test whether rotational speed signals which are in a known relationship with respect to one another are correctly interpreted by the components.

The invention also relates to a wind energy installation which is designed to automatically carry out the method. The wind energy installation comprises a rotational speed sensor which can be used to detect the rotational speed of a shaft. The wind energy installation also comprises a rotational speed relay with a signal input to which a rotational speed signal from the rotational speed sensor can be applied. The rotational speed relay is designed to generate a switch-off command as soon as the rotational speed signal exceeds a predefined rotational speed limit value. A signal generator is also provided in order to generate a test signal equivalent to the rotational speed signal. A changeover module can be used to change over between the rotational speed signal and the test signal at the signal input of the rotational speed relay. Finally, the wind energy installation comprises a control module which controls the signal generator and the changeover module. The control module instructs the changeover module to apply the test signal to the signal input and gives the signal generator the command to generate a test signal beyond the rotational speed limit value. The control module then tests whether the rotational speed relay generates a switch-off command.

The rotational speed relay may have a plurality of signal inputs, and the changeover module may be designed to change over between the rotational speed signal and the test signal at each of the signal inputs. As a result, the method according to the invention can also be carried out automatically when the wind energy installation has a plurality of rotational speed sensors, the rotational speed signals from which are supplied to the rotational speed relay. The wind energy installation may also have a comparison module for comparing the rotational speed signals from the plurality of rotational speed sensors. If a transmission is located between two rotational speed sensors, the rotational speed signal must be accordingly converted so that a comparison becomes possible.

The wind energy installation may be combined with further features described above with reference to the method according to the invention.

BRIEF DESCRIPTION OF THE DRAWINGS

The invention is described by way of example below using an advantageous embodiment and with reference to the accompanying drawings, in which:

FIG. 6: shows a flowchart of the method according to the invention.

DETAILED DESCRIPTION OF THE INVENTION

Figure 1:
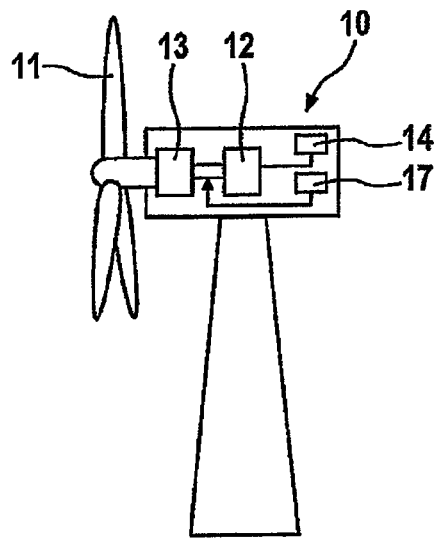
FIG. 1: shows a schematic illustration of a wind energy installation.

In the case of a wind energy installation 10 shown in FIG. 1, a rotor 11 drives a generator 12. The generator is used to convert the rotational energy into electrical energy. The electrical energy is fed into a power supply system (not illustrated). A controller 14 for the wind energy installation 10 controls the interaction between the components of the wind energy installation 10. The controller 14 ensures, inter alia, that a particular predefined rotational speed limit value $n_{limit}$ is not exceeded during normal operation of the wind energy installation 10.

The wind energy installation 10 comprises a transmission 13 with which the slow rotation of a rotor shaft 15 is converted to a higher rotational speed and is delivered to a generator shaft 16 again. The generator shaft 16 is used to drive the generator 12. Although the wind energy installation 10 is designed in such a manner that a rotational speed range limited by rotational speed limit values $n_{limit}$ is not left during normal operation, it is not excluded that one of the rotational speed limit values $n_{limit}$ may be exceeded in extraordinary situations, for example a fault in the controller 14. The wind energy installation 10 therefore comprises a rotational speed relay 17 which intervenes if the rotational speed limit value $n_{limit}$ is exceeded and ensures that the wind energy installation 10 is stopped in a controlled manner. As soon as the rotational speed relay 17 determines that the rotational speed has been exceeded, it passes a switch-off command to a switch-off module 18. The switch-off module 18 carries out emergency switch-off of the wind energy installation 10, which is used to quickly stop the wind energy installation 10. For this purpose, the rotor blades of the rotor 11 are set in such a manner that they no longer receive any critical energy from the wind but rather brake the rotor 11. In order to completely stop the wind energy installation 10, a brake acting on the rotor 11 can additionally be pulled (for example in the case of an excessively low rotational speed).

Figure 2:
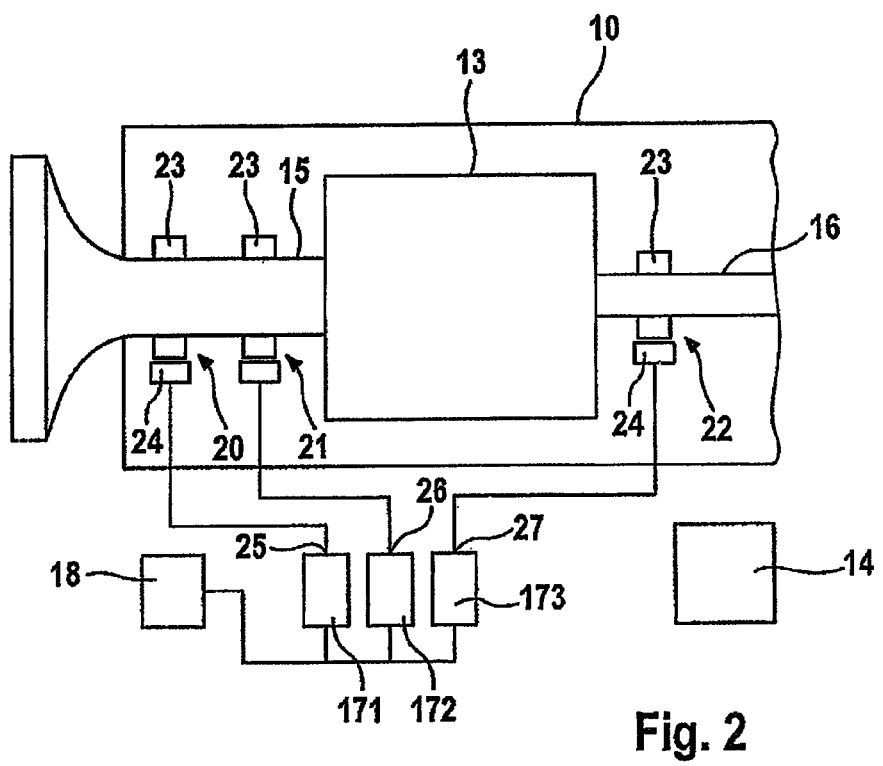
FIG. 2: shows an enlarged illustration of components of the wind energy installation from FIG. 1.
Figure 3:
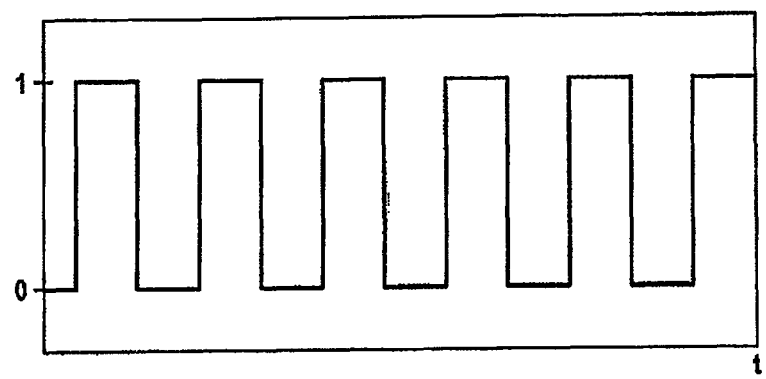
FIG. 3: shows a schematic illustration of a rotational speed signal.

In FIG. 2, the wind energy installation 10 comprises three rotational speed relays 171, 172, 173 which are supplied with information relating to the rotational speed of the rotor shaft 15 and of the generator shaft 16 via three signal inputs 25, 26, 27. In order to generate the rotational speed signal, two rotational speed sensors 20, 21 are formed on the rotor shaft and one rotational speed sensor 22 is formed on the generator shaft. The duplicate design of the rotational speed sensors 20, 21 on the rotor shaft 15 is used for redundancy and to detect the direction of rotation. Each of the rotational speed sensors 20, 21, 22 comprises a toothed disk 23 and an inductive or optical measuring sensor 24. The toothed disks 23 rotate with the rotor shaft 15 and the generator shaft 16, with the result that a tooth or a tooth gap is alternately present at the measuring sensors 24. The measuring sensors 24 pick up this information and use it to generate a square-wave signal, as is illustrated in FIG. 3 by way of example. The square-wave signals are supplied to the signal inputs 25, 26, 27 of the rotational speed relays 171, 172, 173. The square-wave signal is evaluated in the rotational speed relays 171, 172, 173 and the frequency of the square-wave signal is used to determine how fast the associated shaft is rotating.

The rotational speed determined from the square-wave signals is continuously compared with the rotational speed limit value $n_{limit}$, a correspondingly higher rotational speed limit value applying to the square-wave signal from the rapidly rotating rotor shaft 16 than for the slowly rotating rotor shaft 15. If it is determined that the rotational speed limit value $n_{limit}$ has been exceeded at one of the signal inputs 25, 26, 27, the associated rotational speed relay 171, 172, 173 transmits a switch-off command to a switch-off module 18. The switch-off module 18 assumes control of the wind energy installation 10 and rapidly switches off the wind energy installation 10. The switch-off module 18 is prefer-ably arranged in the hub of the wind energy installation 10. Commands from the switch-off module 18 then have priority over commands from the controller 14.

Figure 4:
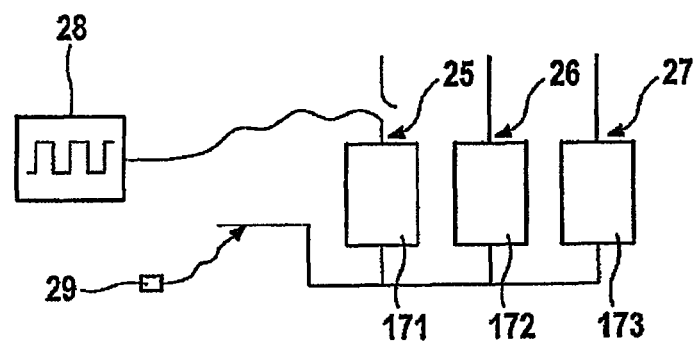
FIG. 4: shows a schematic illustration of a rotational speed relay with a signal generator connected to the latter.

The proper operation of the rotational speed relays 171, 172, 173 is checked at particular maintenance intervals. In the case of an embodiment illustrated in FIG. 4, the method according to the invention is carried out by a service engineer in situ. The service engineer disconnects a connecting line between one of the rotational speed sensors 20, 21, 22 and the associated signal input 25, 26, 27 and thus deactivates the rotational speed signal supplied to the rotational speed relay 171, 172, 173. This is illustrated in FIG. 4 using the example of the signal input 25. Instead of the rotational speed sensor 20, a signal generator 28 is connected to the signal input 25, which signal generator generates a square-wave signal and thus a test signal equivalent to the rotational speed signal. The signal generator 28 is first of all operated in such a manner that the test signal corresponds to a rotational speed which is lower than an upper rotational speed limit value $n_{limit}$. The service engineer increases the frequency of the rotational speed signal until the test signal finally corresponds to a rotational speed which is above the rotational speed limit value $n_{limit}$. In order to test a lower rotational speed limit value, the method is accordingly used with a reduction of the frequency. When the rotational speed limit value $n_{limit}$ has been exceeded, a rotational speed relay 171, 172, 173 operating properly generates a switch-off command. The service engineer uses a measuring device 29 to check whether the switch-off command is correctly generated. If necessary, the switch-off command can also be checked using a corresponding monitoring light on the rotational speed relay 171, 172, 173 or using a fault message which is received in the controller 14. If the switch-off command is correctly generated, the signal generator 28 is disconnected from the signal input 25 and the rotational speed sensor 20 is connected again instead. If the service engineer detects a fault in one of the rotational speed relays 171, 172, 173, the corresponding rotational speed relay must be repaired or replaced. In simple cases, it may suffice to reparameterize the rotational speed relay.

After the method has been concluded for the signal input 25 and the rotational speed relay 171, it is then carried out in the same manner for the signal inputs 26, 27 and the rotational speed relays 172, 173. In the case of the signal input 27 which is responsible for the fast generator shaft 16, the test signal must have a correspondingly higher frequency in order to simulate the case in which the rotational speed limit value $n_{limit}$ is exceeded. If the check for all three signal inputs 25, 26, 27 and all rotational speed relays 171, 172, 173 leads to the result that the switch-off command is correctly generated, the test is successfully concluded and the wind energy installation 10 can be started up normally again.

Figure 5:
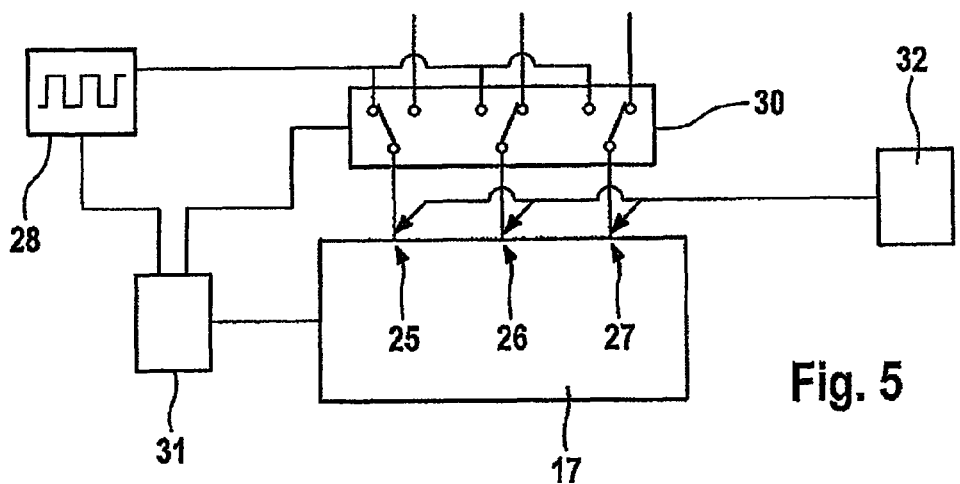
FIG. 5: shows a schematic view of a wind energy installation according to the invention.

In an alternative embodiment shown in FIG. 5, the wind energy installation 10 comprises an individual rotational speed relay 17 with three signal inputs 25, 26, 27. In this example, the wind energy installation 10 is set up in such a manner that the method can be automatically carried out. For this purpose, the signal generator 28 is permanently installed in the wind energy installation 10 and a changeover module 30 is provided in order to apply a test signal from the signal generator 28 to the signal inputs 25, 26, 27 instead of the rotational speed signal. The method is carried out in the same manner as that described with reference to FIG. 4, a control module 31 controlling the signal generator 28 and the changeover module 30 in such a manner that they carry out the steps of the method according to the invention. The control module 31 also checks whether a switch-off command is generated by the rotational speed relay 17 at the correct time in each case.

According to FIG. 5, the wind energy installation 10 also comprises a comparison module 32. The comparison module 32 taps off the rotational speed signals from the rotational speed sensors 20, 21, 22 at the signal inputs 25, 26, 27 of the rotational speed relay 17 and compares the signals with one another. The rotational speed signal from the fast generator shaft 16, which is applied to the signal input 27, is converted according to the transmission ratio of the transmission 13, with the result that a direct comparison with the rotational speed signals from the rotor shaft 15 is possible. If the comparison leads to the result that the same rotational speed information arrives at all three signal inputs 25, 26, 27, this indicates that the rotational speed sensors 20, 21, 22 are operating properly.

FIG. 6 illustrates the method according to the invention in the form of a flowchart. After the method has been started at 100, the connection to the associated rotational speed sensor 20, 21, 22 is disconnected at one of the signal inputs 25, 26, 27 in step 110 and the rotational speed signal is thus deactivated for this signal input. After the signal generator 28 has been connected to the relevant signal input in step 120, the test signal is increased by a value on this side of the rotational speed limit value $n_{limit}$ in step 130 until the rotational speed limit value $n_{limit}$ is exceeded. If the check in step 140 leads to the result that the rotational speed relay has not generated a proper switch-off command, it is determined at 150 that the rotational speed relay 17 is faulty and the method is concluded with step 160.

If the inquiry in step 140 leads to the result that the switch-off command is correctly generated, the signal generator is disconnected from the signal input at 170 and a connection to the associated rotational speed sensor is established again. The method is then carried out in the same manner for the other signal inputs.

In step 180, the rotational speed signal is tapped off at the signal inputs 25, 26, 27 as the rotor 11 rotates. The rotational speed signal at the signal input 27 is converted according to the transmission ratio of the transmission 13, with the result that a direct comparison with the rotational speed signal at the signal inputs 25, 26 is possible. If the inquiry in step 200 leads to the result that the rotational speed signals match, the check has been successful and the method is concluded at 210. If a discrepancy between the rotational speed signals is determined in step 200, a fault message is output in step 220 and the rotational speed sensors 20, 21, 22 must be checked.

The invention claimed is:

1. A method for testing a rotational speed relay of a wind energy installation, wherein the wind energy installation comprises a rotational speed sensor configured to detect the rotational speed of a shaft, the rotational speed sensor outputs a rotational speed signal, the rotational speed signal is supplied to a signal input of the rotational speed relay, and the rotational speed relay generates a switch-off command if the rotational speed of the shaft exceeds a predefined rotational speed limit value, wherein the switch-off command is an electrical signal that is transmitted from the rotational speed relay to a switch-off module that is configured to switch off the wind energy installation and the switch-off command independently activates the switch-off module, the method comprising:

deactivating the rotational speed signal supplied to the rotational speed relay;

activating a signal generator which generates a test signal equivalent to the rotational speed signal and supplying the test signal to the signal input of the rotational speed relay;

operating the signal generator with a test signal beyond the rotational speed limit value; and testing the switch-off command from the rotational speed relay.

2. The method as claimed in claim 1, comprising operating the signal generator with a test signal with which the rotational speed limit value is not exceeded and changing the test signal such that the rotational speed limit value is exceeded.

3. The method as claimed in claim 1 or 2, comprising providing automatic changeover between the rotational speed signal and the test signal for the signal input of the rotational speed relay.

4. The method as claimed in claim 1 or 2, comprising applying the test signal to a plurality of signal inputs of the rotational speed relay.

5. The method as claimed in claim 1 or 2, wherein the wind energy installation comprises a plurality of rotational speed relays, and wherein the method is carried out for all rotational speed relays.

6. The method as claimed in claim 1 or 2, wherein the wind energy installation comprises a plurality of rotational speed sensors, and comprising comparing rotational speed signals from the rotational speed sensors with one another.

7. A wind energy installation comprising:

a rotational speed sensor configured to detect the rotational speed of a shaft;

a rotational speed relay comprising a signal input to which a rotational speed signal from the rotational speed sensor is applied, the rotational speed relay being configured to generate a switch-off command as soon as the rotational speed signal exceeds a predefined rotational speed limit value, wherein the switch-off command is an electrical signal that is transmitted from the rotational speed relay to a switch-off module that is configured to switch off the wind energy installation and the switch-off command independently activates the switch-off module;

a signal generator configured to generate a test signal equivalent to the rotational speed signal;

a changeover module configured to change over between the rotational speed signal and the test signal at the signal input of the rotational speed relay; and a control module configured to control the signal generator such that the signal generator generates the test signal beyond the rotational speed limit value, instruct the changeover module to apply the test signal to the signal input and check whether the rotational speed relay generates a switch-off command.

8. The wind energy installation as claimed in claim 7, wherein the rotational speed relay comprises a plurality of signal inputs and wherein the changeover module is configured to change over between the rotational speed signal and the test signal at each of the signal inputs.

9. The wind energy installation as claimed in claim 7 or 8, comprising a comparison module configured to compare the rotational speed signals from a plurality of rotational speed sensors.

* * * * *